United States Patent
Takizawa

(10) Patent No.: US 8,300,443 B2
(45) Date of Patent: Oct. 30, 2012

(54) SEMICONDUCTOR MODULE FOR USE IN POWER SUPPLY

(75) Inventor: Satoki Takizawa, Tokyo (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 597 days.

(21) Appl. No.: 12/461,659

(22) Filed: Aug. 19, 2009

(65) Prior Publication Data

US 2010/0039843 A1   Feb. 18, 2010

(51) Int. Cl.
*H02M 1/00*   (2007.01)

(52) U.S. Cl. .................. 363/147; 363/144; 363/132

(58) Field of Classification Search .............. 363/132, 363/144, 147
See application file for complete search history.

(56) References Cited

U.S. PATENT DOCUMENTS

| | | | |
|---|---|---|---|
| 5,459,655 A * | 10/1995 | Mori et al. ............... | 363/132 |
| 5,623,399 A * | 4/1997 | Ishii et al. ............... | 363/132 |
| 2005/0111246 A1* | 5/2005 | Lai et al. ................. | 363/157 |
| 2011/0222325 A1* | 9/2011 | Komatsu ................. | 363/127 |

FOREIGN PATENT DOCUMENTS

| | | |
|---|---|---|
| JP | 03-247002 A | 11/1991 |
| JP | 3007494 | 11/1994 |
| JP | 10-285950 A | 10/1998 |
| JP | 2001-045772 A | 2/2001 |
| JP | 2001-168278 A | 6/2001 |
| JP | 2002-247862 A | 8/2002 |
| JP | 2002-369549 A | 12/2002 |
| JP | 2003-303939 A | 10/2003 |

OTHER PUBLICATIONS

"Fuji IGBT Modules Application Manual," Fuji Electric, Feb. 2004 REH984 (95 pages).

* cited by examiner

*Primary Examiner* — Jessica Han
(74) *Attorney, Agent, or Firm* — Rabin & Berdo, P.C.

(57) ABSTRACT

A series connection circuit of IGBTs and an AC switch are contained in one package. The series connection circuit is connected between the positive and negative terminals of a DC power source, and the AC switch is connected between a neutral point of the DC power source and a series connection point between the IGBTs. Straight conductor strips can be used to connect terminals on the package to the DC power source, thereby reducing inductance and thus also reducing voltage spikes.

18 Claims, 14 Drawing Sheets

SEMICONDUCTOR MODULE FOR USE IN POWER SUPPLY

BACKGROUND OF THE INVENTION

1. Field of the Invention

The present invention relates to the construction of a power semiconductor module used for a 3-level or 3-phase inverter or a resonance type inverter.

2. Description of the Related Art

FIG. 8 shows a circuit example of a 3-phase inverter for converting DC to AC, which uses a related art. The construction of this circuit is disclosed in JP-A-2002-247862. In FIG. 8, reference numerals 1 and 2 represent DC power sources connected to each other in series, and a terminal with a positive potential is represented by P, a terminal with a negative potential is represented by N, and a terminal with a neutral (middle) point potential is represented by M. In general, this DC power source may be an AC-powered DC source system, constructed by using diode rectifiers, large-capacity electrolytic capacitors, etc. (not shown).

Series-connected circuits of IGBTs (insulated gate bipolar transistors), corresponding to three phases, are connected between the positive terminal P and the negative terminal N. Diodes are connected in a reverse parallel manner (that is, in a back-to-back connection manner) to the IGBTs. In more detail, a series connection circuit 60 for a U-phase includes an upper arm comprising an IGBT 11 to which a diode 12 is connected in a reverse parallel style (that is, the cathode is connected to the collector of IGBT 11 and the anode is connected to the emitter) and a lower arm comprising an IGBT 13 to which a diode 14 is connected in a reverse parallel style, the upper and lower arms being series-connected. Series connection circuit 61 for a V-phase includes an upper arm comprising an IGBT 21 to which a diode 22 is connected in a reverse parallel style and a lower arm comprising an IGBT 23 to which a diode 24 is connected in a reverse parallel style. Similarly, a series connection circuit 62 for a W-phase includes an upper arm comprising an IGBT 31 to which a diode 32 is connected in a reverse parallel style and a lower arm comprising an IGBT 33 to which a diode 34 is connected in a reverse parallel style.

An AC switch is connected between the series-connection point of the upper arm and the lower arm of the series-connection circuit of each phase and the DC neutral point potential M, and an IGBT to which a diode is connected in a reverse parallel style is connected to the AC switch in a reverse series style. That is, an AC switch circuit is constructed so that an emitter of an IGBT module 63 (comprising an IGBT 81 to which a diode 82 is connected in a reverse parallel style) is connected to an emitter of an IGBT module 64 (comprising an IGBT 83 to which a diode 84 is connected in a reverse parallel style), and the AC switch circuit concerned is connected between the series-connection point of the series-connection circuit 60 for the U-phase and the neutral point M of the DC power source. Another AC switch circuit is constructed so that an emitter of an IGBT module 65 (comprising an IGBT 85 to which a diode 86 is connected in a reverse parallel style) is connected to an emitter of an IGBT module 66 (comprising an IGBT 87 to which a diode 88 is connected in a reverse parallel style), and the AC switch circuit concerned is connected between the series-connection point of the series-connection circuit 61 for the V-phase and the neutral point M of the DC power source. A further AC switch circuit is constructed so that an emitter of an IGBT module 67 (comprising an IGBT 89 to which a diode 90 is connected in a reverse parallel style) is connected to an emitter of an IGBT module 68 (comprising an IGBT 91 to which a diode 92 is connected in a reverse parallel style), and the AC switch circuit concerned is connected between the series-connection point of the series-connection circuit 62 for the W-phase and the neutral point M of the DC power source. The series-connection point of each of the series-connection circuits 60, 61, and 62 serves as an AC output, and the AC outputs are connected to a load 74 through filter reactors 71, 72, and 73.

With the circuit construction described above, the series-connection points of the respective series-connection circuits 60, 61, and 62 can output voltages at the positive terminal P, the negative terminal N, and the neutral point terminal M, and thus a 3-phase inverter output is obtained. FIG. 9 shows an example of an output voltage (Vout) waveform. This is characterized in that an AC voltage having three voltage levels and a little low-order harmonic component is output to another unit, and output filters 71 to 73 can be miniaturized.

Furthermore, when the 3-phase inverter is constructed as a current IGBT module, a 2-in-1 type IGBT module as shown in FIGS. 10A and 10B is used for the series-connection circuits 60, 61, and 62, and a 1-in-1 type IGBT module as shown in FIGS. 11A and 11B is used for the series-connection circuits 63 to 68. The 2-in-1 type module includes a C1 terminal (93) connected to the positive terminal P, an E2 terminal (94) connected to the negative terminal N, and an E1C2 terminal (95) connected to a load output and an AC switch, and the terminals are generally constructed in the order shown in FIG. 10A. As shown in FIG. 11B, the 1-in-1 type module has a collector terminal C(100) and an emitter terminal E(101) as output terminals.

FIG. 14 is a diagram showing the construction (top view) when one phase of the circuit in FIG. 8 using these IGBT modules. This circuit is constructed by the IGBT modules 60, 63, and 64 and with electrolytic capacitors 1 and 2 serving as DC power sources. These elements are connected to one another by electrical conductors. The circuit is the U-phase of the arrangement shown in FIG. 8. That is, the 2-in-1 type IGBT module 60 is used as the series-connection circuit, and the AC switch is implemented by an reverse series-connection circuit which is designed so that the emitters of the 1-in-1 type IGBT modules 63 and 64 are connected to each other. Electrical conductors 110 to 114 for connecting the DC power sources 1 and 2 and the IGBT modules 60, 63, and 64 are required. There are disadvantages in that the number of electrical conductors to be used is large, electrical conductors having complicated shapes are required, and also the inductance is increased. The form and the construction of the conventional IGBT modules are disclosed in "FUJI IGBT MODULE APPLICATION MANUAL," RH984, issued in February, 2004.

FIG. 12 shows an equivalent circuit which is drawn by paying attention to the wire inductance of the circuit for one phase in FIG. 8. The respective inductances L1, L2, L3, L4 are mainly based on wiring between the IGBT modules and between the IGBT modules and the DC power source (electrolytic capacitors). Each electrical conductor normally ranges from about several centimeters to several centimeters in excess of ten, and thus each inductance value ranges from about 10 nH to about several tens of nH.

In FIG. 12, when IGBT 11 is turned off from an ON state (so that current I flows, indicated by a broken line), IGBT 81 (turned on in advance) and a diode 84 are conductive, and commutation is executed on a current passage Ix. At this time, a voltage in the direction indicated by an arrow in FIG. 12 transiently occurs in the inductances L1, L2, L3, L4 in accordance with the current variation rate (di/dt) of IGBT.

As a result, the voltage represented in the following expression (1) is applied between the collector and the emitter of IGBT 11 at maximum. FIG. 13 shows the waveforms of the collector current (ic) and the voltage ($V_{CE}$) between the collector and the emitter when IGBT 11 is turned off.

$$V_{CE}(peak)=Edp+(L_1+L_2+L_3+L_4)\cdot di/dt \quad (1)$$

$$\text{Surge voltage } \Delta V=(L_1+L_2+L_3+L_4)\cdot di/dt \quad (2)$$

Edp: DC voltage of DC power source 1.

di/dt: current variation rate of the IGBT when it is turned off.

$L_1, L_2, L_3, L_4$: inductance values of respective conductors.

As an example, in the case of an IGBT that with a rating of several 100 A, di/dt is equal to about 5000 A/μs at maximum. Therefore, assuming that $L_1+L_2+L_3+L_4=100$ nH is satisfied, the voltage corresponding to the surge $(L_1+L_2+L_3+L_4)$ di/dt in the expression (1) is equal to 500V.

As described above, due to existence of $L_1, L_2, L_3, L_4$, the peak voltage value applied to an IGBT when it is turned off is increased to be higher than the DC voltage Edp by the amount corresponding to the surge voltage of the expression (2). Therefore, the IGBT chip and an FWD chip connected in a reverse parallel style are required to have high withstand voltages (high voltage tolerance). Normally, the chip area of a chip having a high withstand voltage is generally increased in proportion to the withstand voltage. Therefore, there is a problem in that the module must be designed to be fairly large and the cost thereof is increased.

SUMMARY OF THE INVENTION

According to a first aspect of the present invention, a power semiconductor module applied to a voltage type 3-level inverter comprises: a first IGBT whose collector is connected to a positive electrode terminal of a DC circuit and to which a diode is connected in a reverse parallel style; a second IGBT whose emitter is connected to a negative electrode terminal of the DC circuit and to which a diode is connected in a reverse parallel style; and a semiconductor AC switch connected between a connection point of the emitter of the first IGBT and the collector of the second IGBT and a neutral point terminal provided between the positive and negative electrode terminals of the DC circuit, wherein the first IGBT, the second IGBT and the semiconductor AC switch are mounted in one package.

According to a second aspect of the present invention, a power semiconductor module applied to a voltage type 3-level inverter comprises: a plurality of one-phase switch circuits each of which includes a first IGBT whose collector is connected to a positive electrode terminal of a DC circuit and to which a diode is connected in a reverse parallel style; a second IGBT whose emitter is connected to a negative electrode terminal of the DC circuit and to which a diode is connected in a reverse parallel style; and a semiconductor AC switch connected between a connection point of the emitter of the first IGBT and the collector of the second IGBT and a neutral point terminal provided between the positive and negative electrode terminals of the DC circuit, wherein the plural one-phase switch circuits are mounted in one package.

According to a third aspect of the present invention, an emitter of a third IGBT to which a diode is connected in a reverse parallel style is connected to an emitter of a fourth IGBT to which a diode is connected in a reverse parallel style, thereby constructing the semiconductor AC switch.

According to a fourth aspect of the present invention, a collector of a third IGBT to which a diode is connected in reverse parallel style is connected to a collector of a fourth IGBT to which a diode is connected in a reverse parallel style, thereby constructing the semiconductor AC switch.

According to a fifth aspect of the present invention, the semiconductor AC switch is constructed by connecting a reverse blocking IGBT in a reverse parallel style.

According to a sixth aspect of the present invention, the neutral point terminal is divided into a first neutral point terminal and a second neutral point terminal.

According to a seventh aspect of the present invention, the positive electrode terminal, the negative electrode terminal and the neutral point terminal are arranged on a line.

According to this invention, in the 3-phase inverter shown in FIG. 8, the IGBT series connection circuit connected to the positive terminal P and the negative terminal N of the DC power source, and IGBTs operating as the AC switch connected between the series connection point of the IGBT series connection circuit and the neutral point terminal M of the DC power source, are packaged as an integral type IGBT module, so that the wires between the respective IGBTs are not required. As a result, the wire inductance between the DC power source and the IGBT module is reduced, and the voltage $V_{CE(peak)}$ applied to IGBT when it is turned off can be reduced. In addition, the withstand voltages can be reduced, and the IGBT module can be miniaturized and reduced in cost. Furthermore, the number of electrical conductors being used can be reduced as compared with the prior art, the shapes of the electrical conductors can be simplified, and the number of steps can be reduced, so that the price of the device can be reduced.

DETAILED DESCRIPTION OF THE PREFERRED EMBODIMENTS

In the present invention an IGBT series-connection circuit is connected to a terminal with a positive potential P and a terminal with a negative potential N of a DC (direct current) power source, and an IGBT (insulated gate bipolar transistor) operating as an AC switch is connected between a series-connection point of the IGBT series-connection circuit and a neutral point terminal M of the DC power source, and they are constructed as an integral type IGBT module in a 3-phase inverter. As a result, electrical conductors which have hitherto been required between IGBTs are unnecessary.

First Embodiment

Figure 1A:
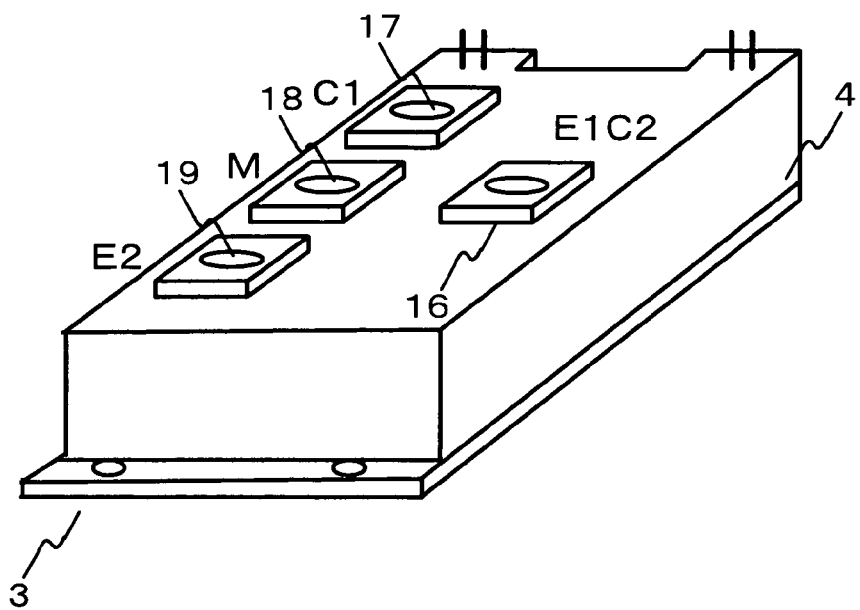
FIG. 1A shows a perspective view of a module according to a first embodiment of the present invention.
Figure 1B:
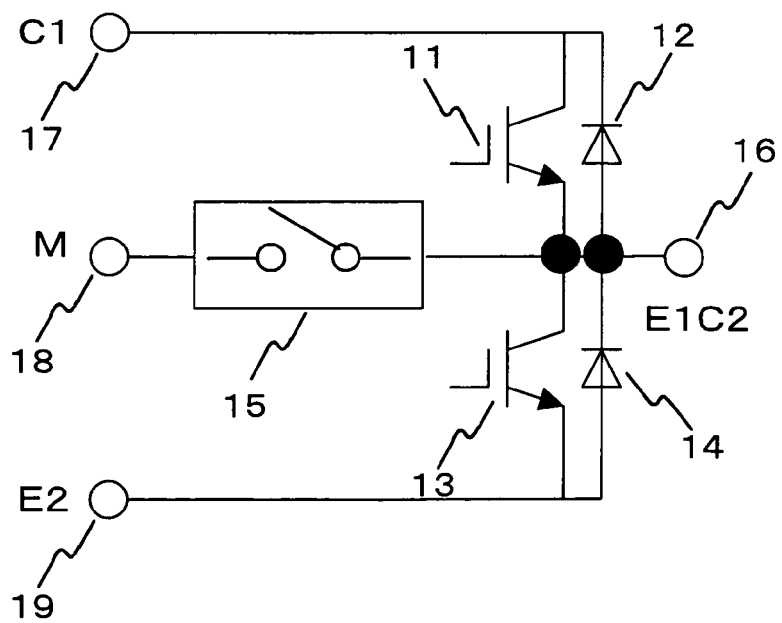
FIG. 1B is a circuit diagram showing the construction of the module.
Figure 8:
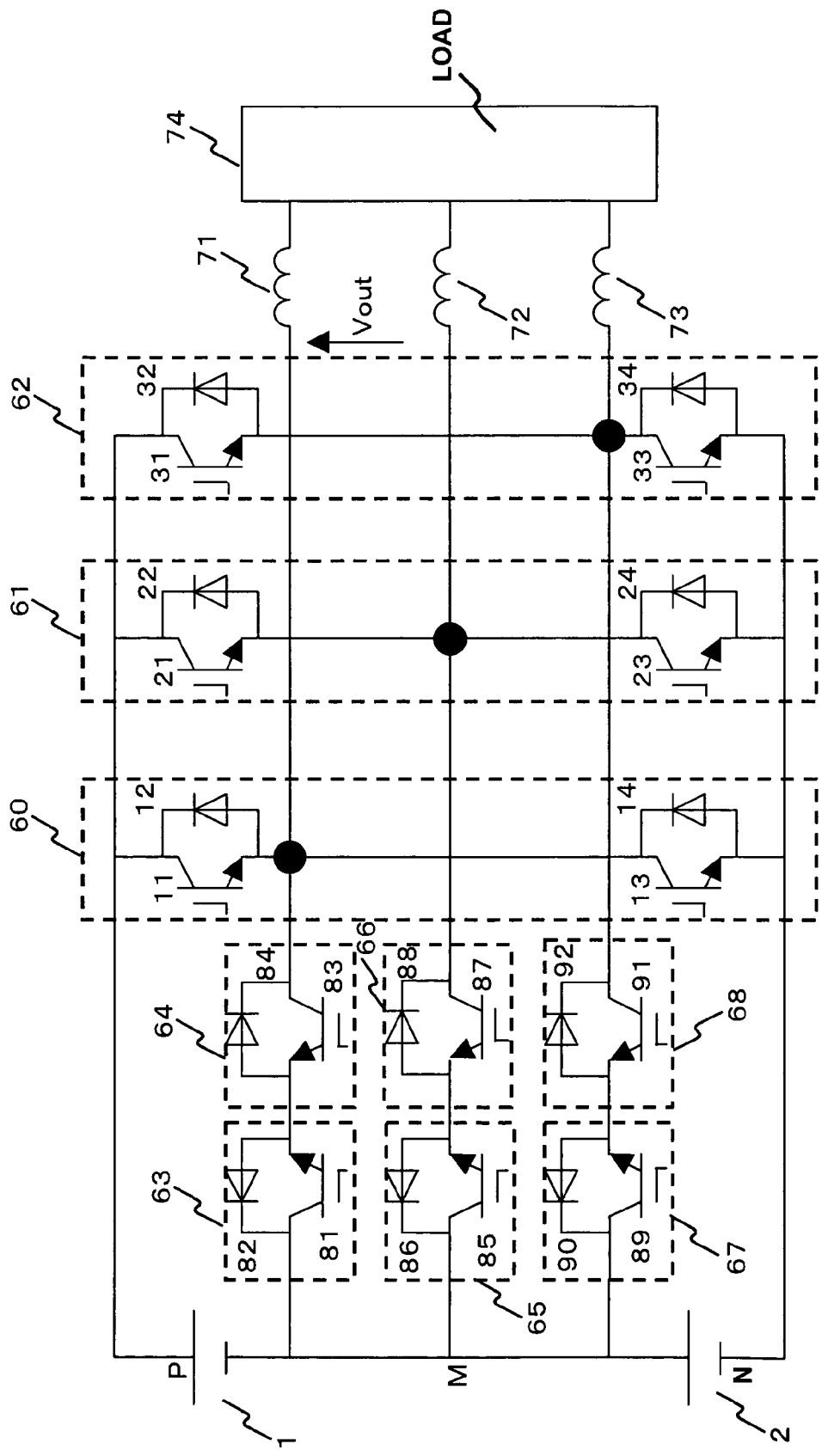
FIG. 8 shows an example of a circuit construction using a conventional module.
Figure 9:
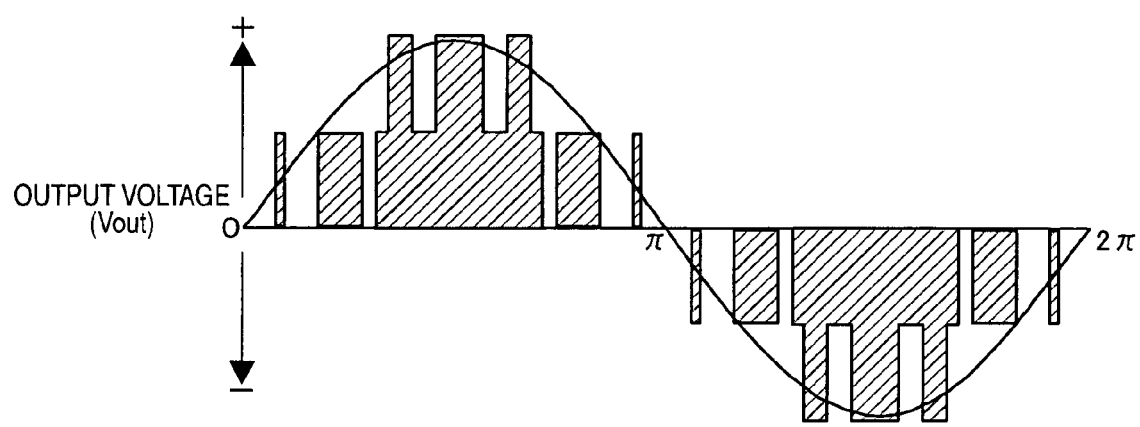
FIG. 9 shows an example of an output waveform of a 3-level inverter.
Figure 10A:
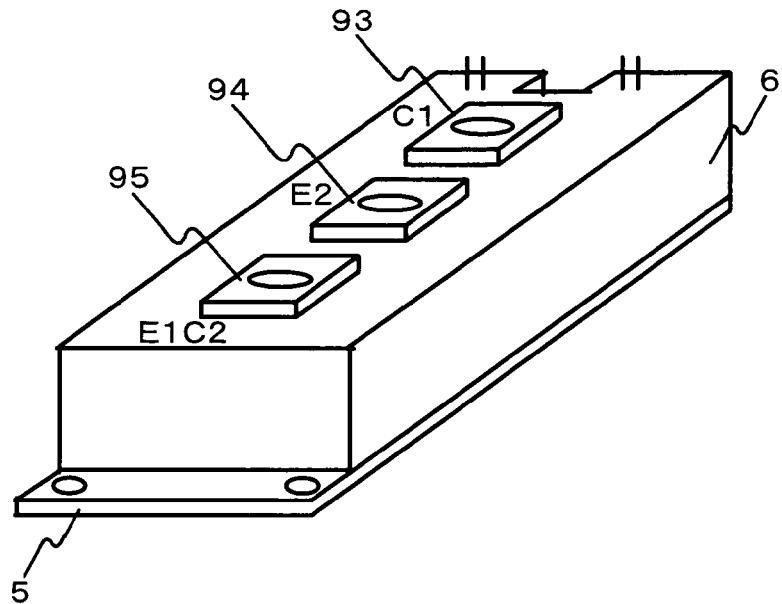
FIGS. 10A and 10B show a conventional IGBT module (2-in-1 type)
Figure 10B:
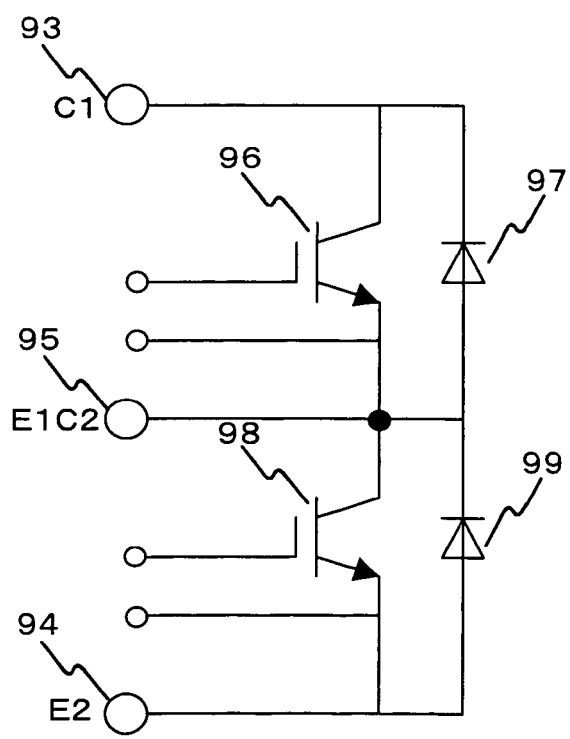
Figure 11A:
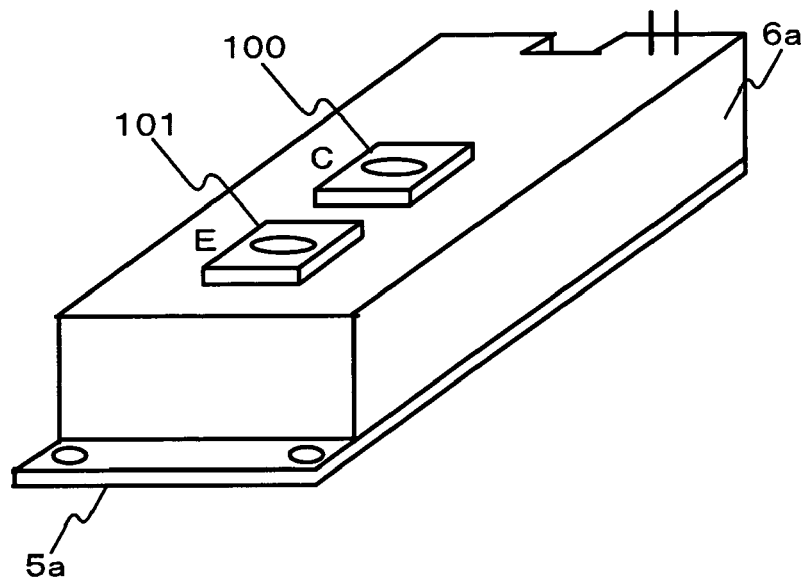
FIGS. 11A and 11B show a conventional IGBT module (1-in-1 type)
Figure 11B:
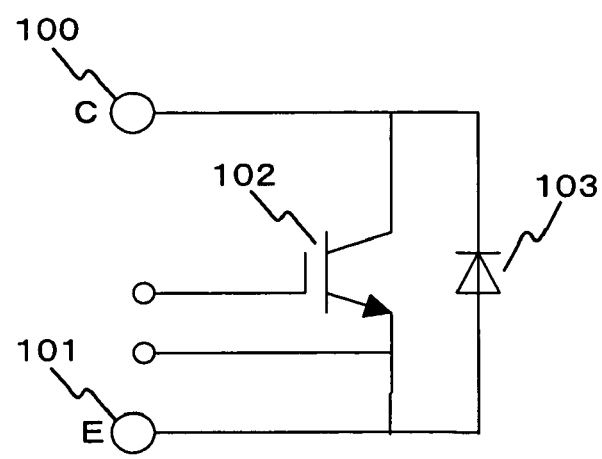
Figure 12:
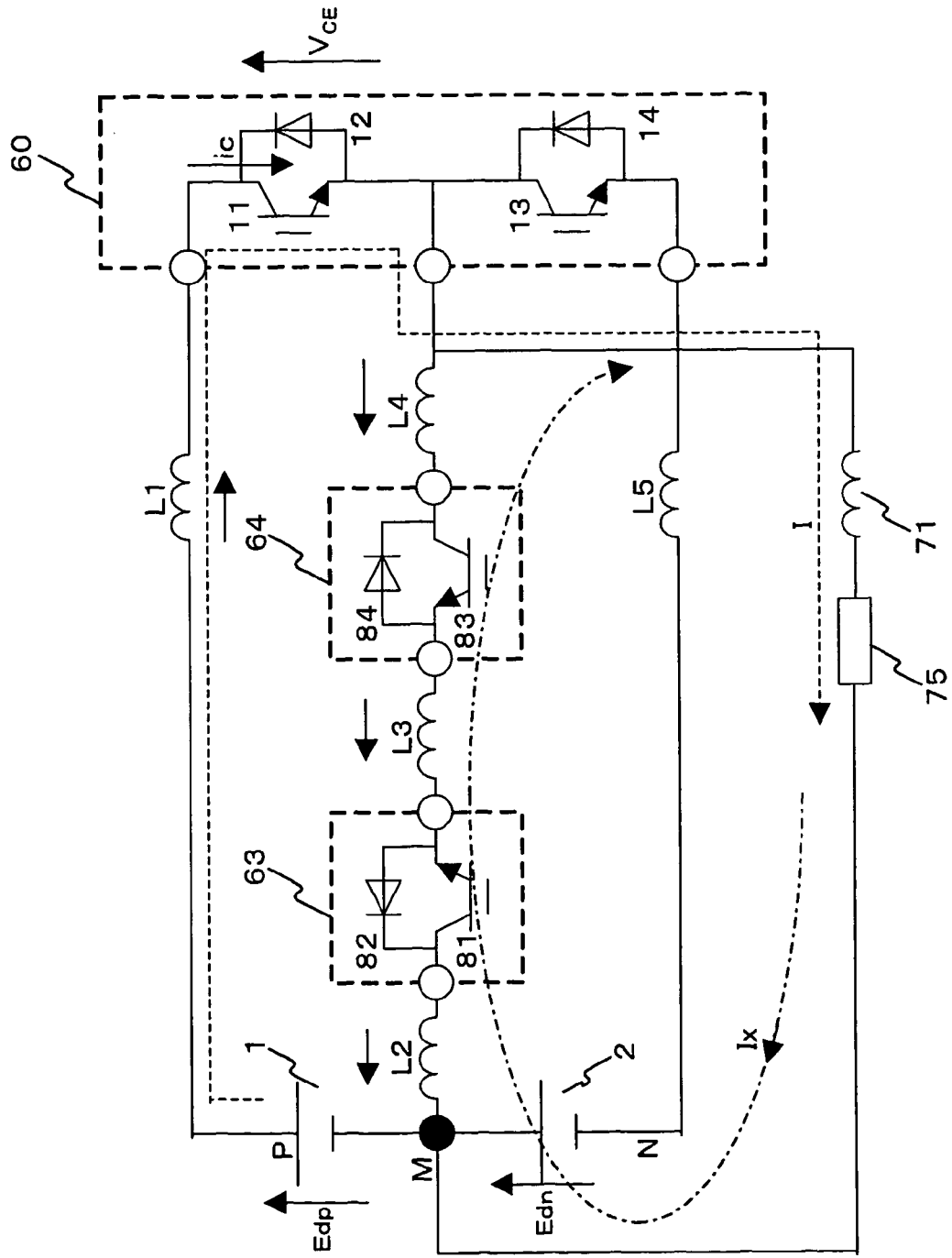
FIG. 12 is an equivalent circuit (one phase) using the conventional IGBT modules.
Figure 13:
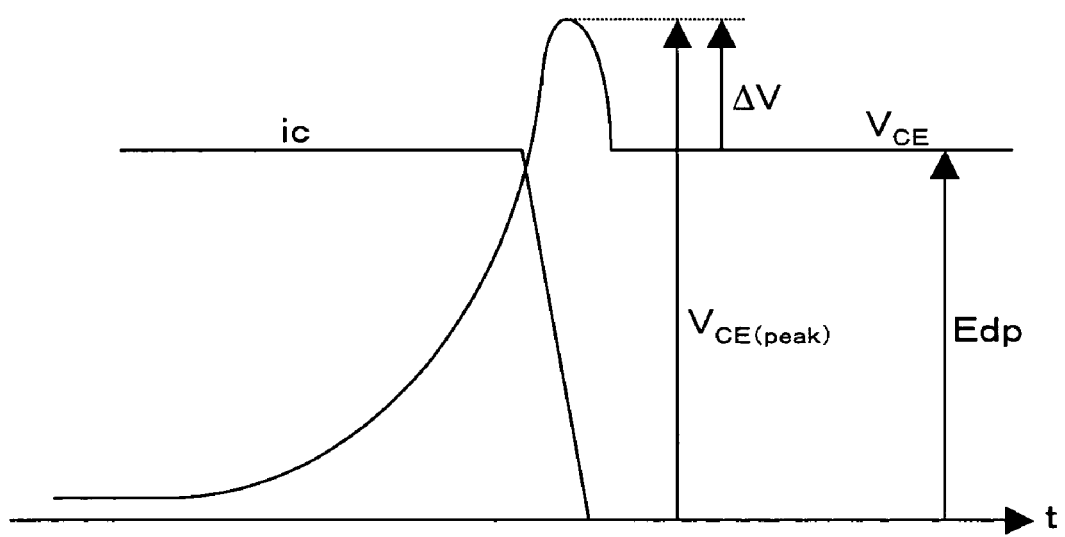
FIG. 13 shows voltage and current waveforms when an IGBT is turned off.

FIGS. 1A and 1B show a first embodiment of the present invention. In this embodiment, elements of one phase (in this case, the U-phase) in FIG. 8 are packaged as one module. FIG. 8 is discussed in the "Background of the Invention" section of this application. FIG. 1A shows a prospective view of the module, and FIG. 1B shows the circuit construction of the module. The elements such as IGBTs 11 and 13, diodes 12 and 14, and an AC (alternating current) switch 15 are made from semiconductor elements. A terminal 17 is a C1 terminal that receives a positive potential P of a DC power source, a terminal 18 is an M terminal that receives a neutral point potential M of the DC power source, and a terminal 19 is an E2 terminal that receives a negative potential N of the DC power source. A terminal 16 is an E1C2 terminal connected to a load. In FIG. 1A, reference numeral 3 represents a metal base substrate on which semiconductor chips and wiring members are insulated and mounted, and reference numeral 4 represents an insulating case of the module. The base substrate 3 also serves to transmit heat to cooling fins (not shown). Furthermore, in FIG. 1A, the terminals C1, M, and E2 are arranged in a line on the module.

Figure 6A:
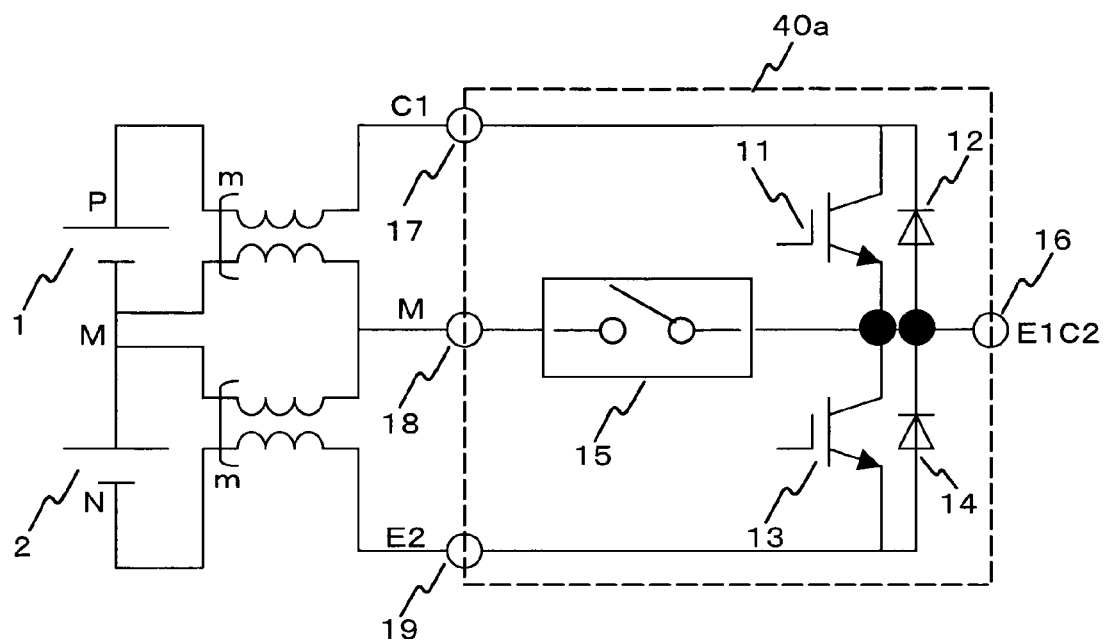
FIGS. 6A and 6B show an example of a wiring structure using the module of the first embodiment.
Figure 6B:
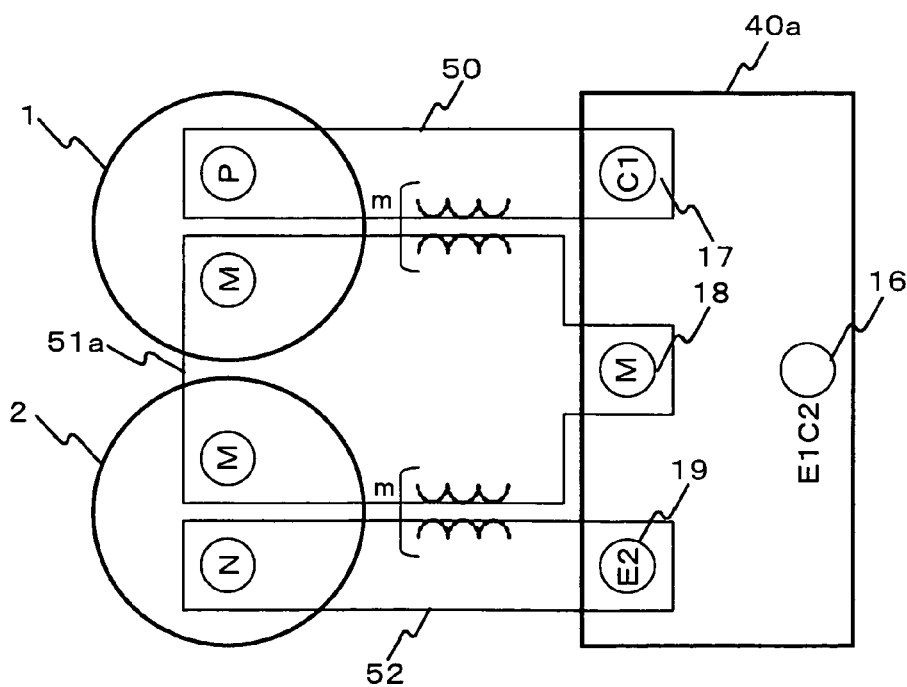
Figure 14:
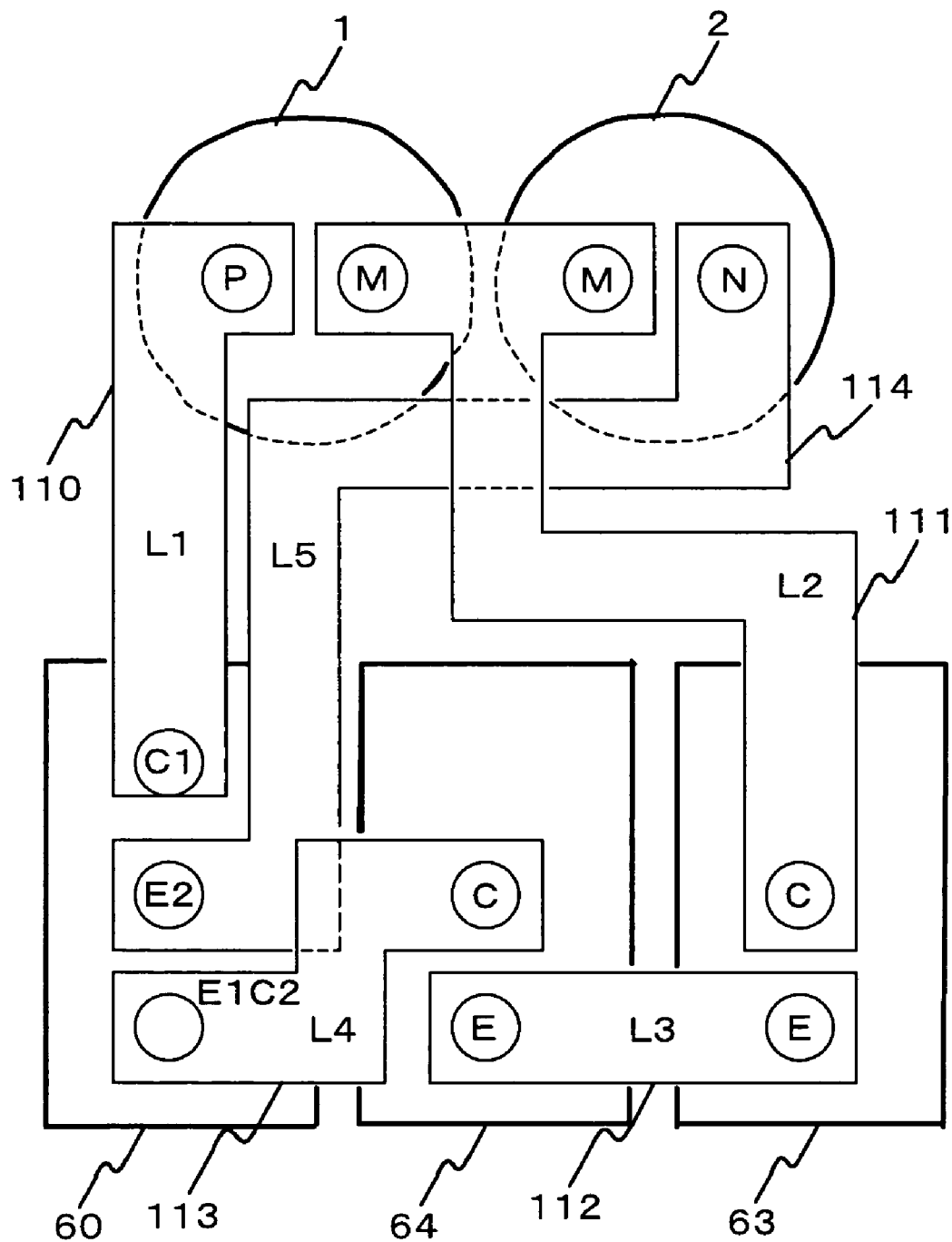
FIG. 14 shows an example of wiring using the conventional IGBT modules.

FIGS. 6A and 6B show an example of the connection to the DC power sources when the module of this embodiment is used. With respect to the connection between the module 40a and the DC power sources 1 and 2, the connection between the C1 terminal of the module and the positive electrode potential P of the DC power source is performed by an electrical conductor 50, the connection between the M terminal of the module and the neutral point potential M of the DC power sources is performed by an electrical conductor 51a, and the connection between the terminal E2 of the module and the negative electrode potential N of the DC power source is performed by an electrical conductor 52. As compared with the conventional construction shown in FIG. 14, the electrical conductors can be arranged substantially linearly, and approximate wiring (or laminate wiring) can be easily performed between the P-C1 conductor (50) and the M conductor (51a) and between the M conductor (51a) and the N-E2 conductor (52). Accordingly, the wiring inductance therebetween can be reduced. FIG. 6A shows a circuit model diagram. Mutual inductance m occurs between the conductors 50 and 51a and between the conductors 51a and 51 due to the close wiring (or the laminate wiring), and the inductance value among the terminal C1 of the module, the DC power source 1 and the terminal M of the module and the inductance value among the terminal M of the module, the DC power source 2 and the module terminal E2 can be greatly reduced. The conductor 51a is substantially wider than the conductors 50 and 52 except near terminal 18, as shown in FIG. 6B.

Second Embodiment

Figure 2A:
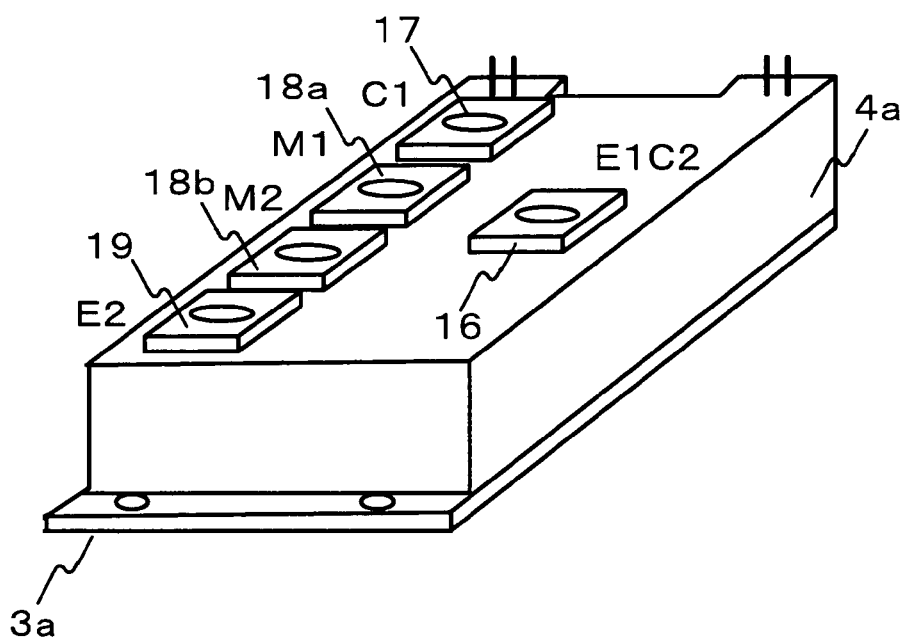
FIG. 2A shows a perspective view of a module according to a second embodiment of the present invention.
Figure 2B:
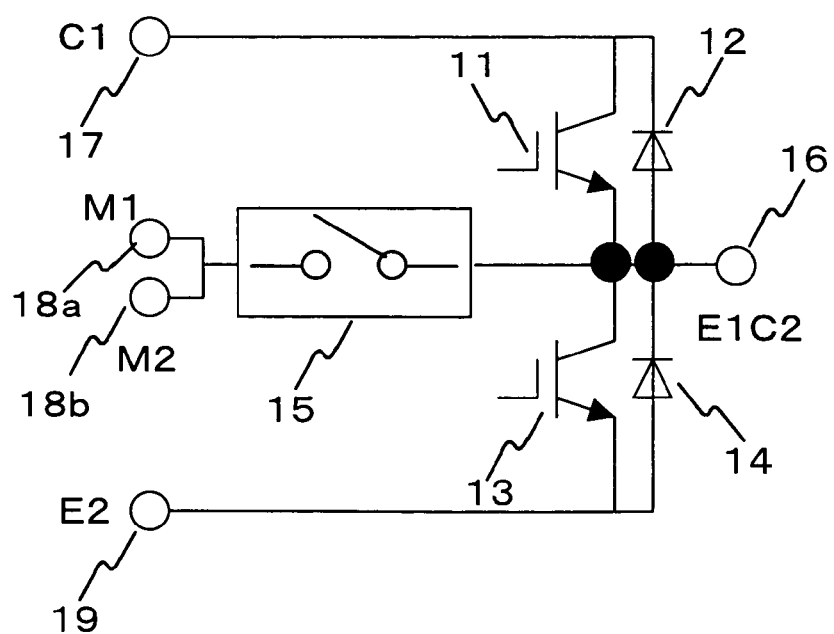
FIG. 2B is a circuit diagram showing the construction of the module.
Figure 7A:
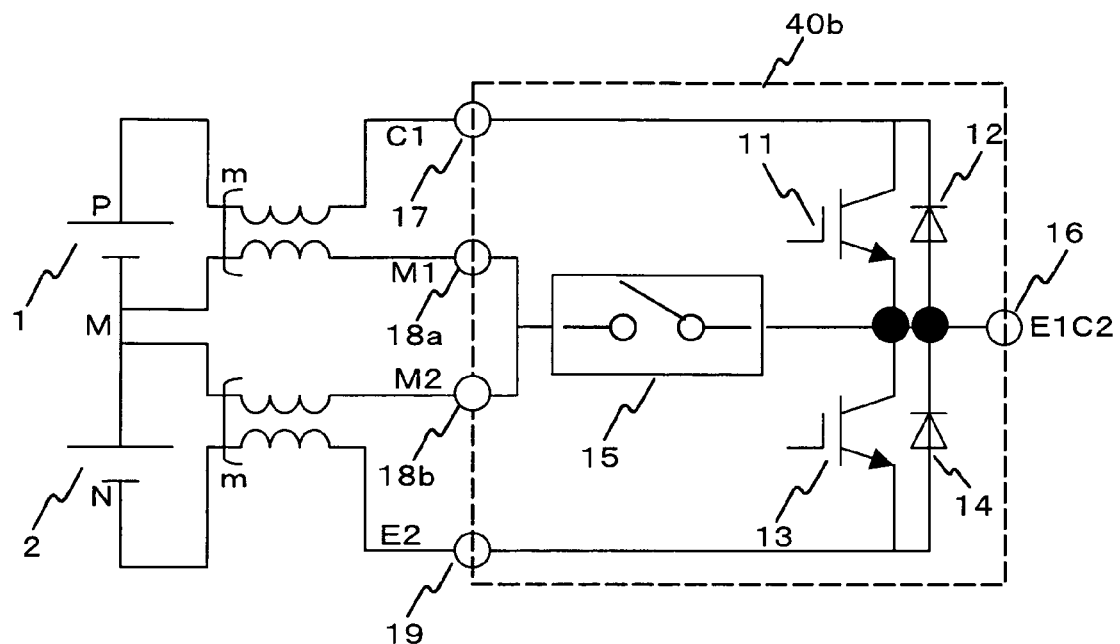
FIGS. 7A and 7B show an example of a wiring structure using the module of the second embodiment.
Figure 7B:
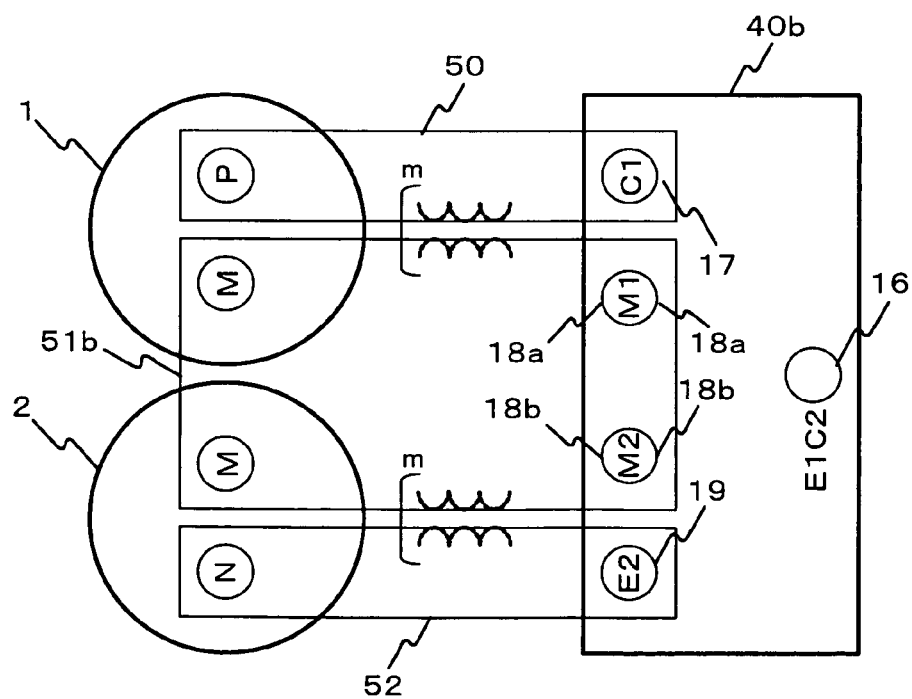

FIGS. 2A and 2B show a second embodiment of the present invention. The difference from the first embodiment resides in that the terminal connected to the neutral point potential M of the DC power source is divided into terminals M1 and M2, and the other construction is identical to that of the first embodiment. FIGS. 7A and 7B show an example of the connection between the module and the DC power source when the module of this invention is used. FIG. 7A shows the circuit construction, and FIG. 7B is a wiring diagram. By providing the module with two terminals M1 and M2, the structure of the electrical conductor 51b is simplified, and the number of steps can be reduced. In addition, the inductance can be further reduced.

Third Embodiment

Figure 3A:
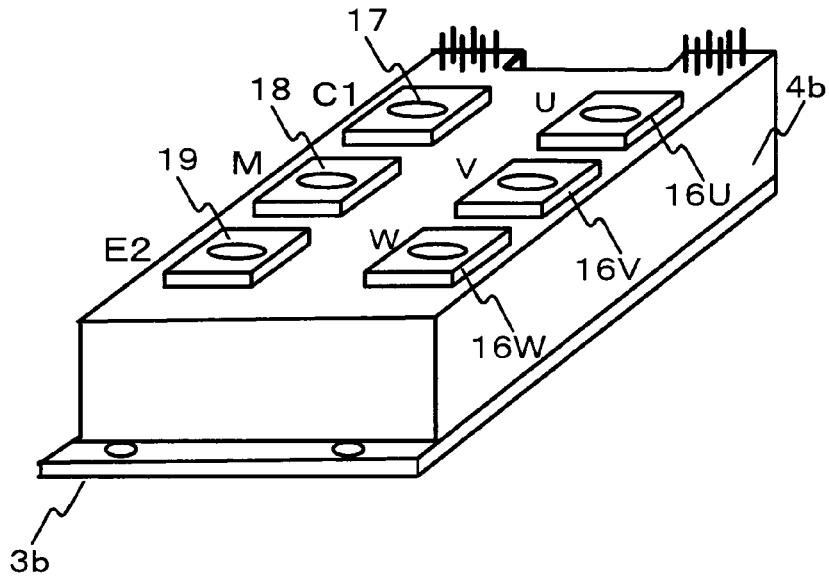
FIG. 3A shows a perspective view of a module according to a third embodiment of the present invention.
Figure 3B:
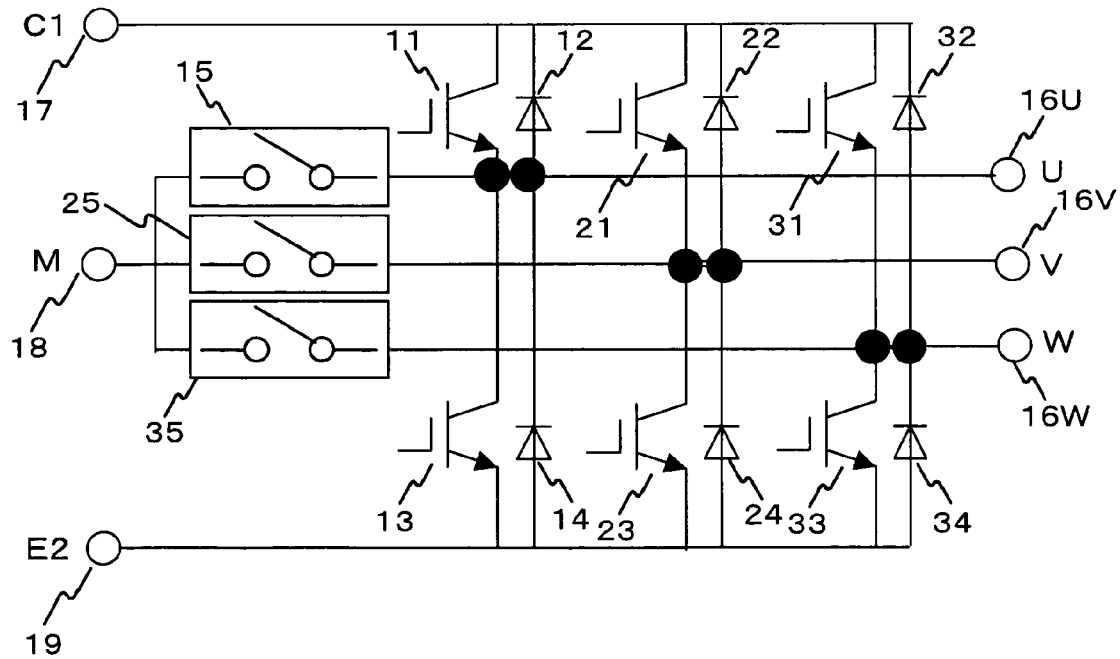
FIG. 3B is a circuit diagram showing the construction of the module.

FIGS. 3A and 3B show a third embodiment of the present invention. The elements of the three phases in FIG. 8 are packaged in one module. FIG. 3A shows the outlook of the module, and FIG. 3B shows the circuit construction. IGBTs 11, 13, 21, 23, 31, and 33, diodes 12, 14, 22, 24, 32, and 34, and AC switches 15, 25, and 35 are provided as semiconductor elements. A terminal 17 is a C1 terminal that receives the positive electrode potential P of the DC power source, a terminal 18 is an M terminal that receives the neutral point potential M of the DC power source, a terminal 19 is an E2 terminal that receives the negative electrode potential N of the DC power source. Terminals 16U, 16V, and 16W are the U, V, and W terminals connected to a three phase load. In FIG. 3A, reference numeral 3b represents a metal base substrate on which semiconductor chips and wiring members are insulated and mounted, and reference numeral 4b represents an insulating case of the module. The base substrate 3b also serves to transmit heat to cooling fins (not shown). Furthermore, in FIG. 3A, the terminals C1, M, and E2 are arranged in a line on the module. The elements of the three phases are packaged as one module, and thus the connection to the DC power source is further simplified as compared with the first and second embodiments. Accordingly, in addition to a reduction of the wiring inductance, the number of steps for device fabrication can be reduced and thus the price of the device can be reduced.

Fourth Embodiment

Figure 4A:
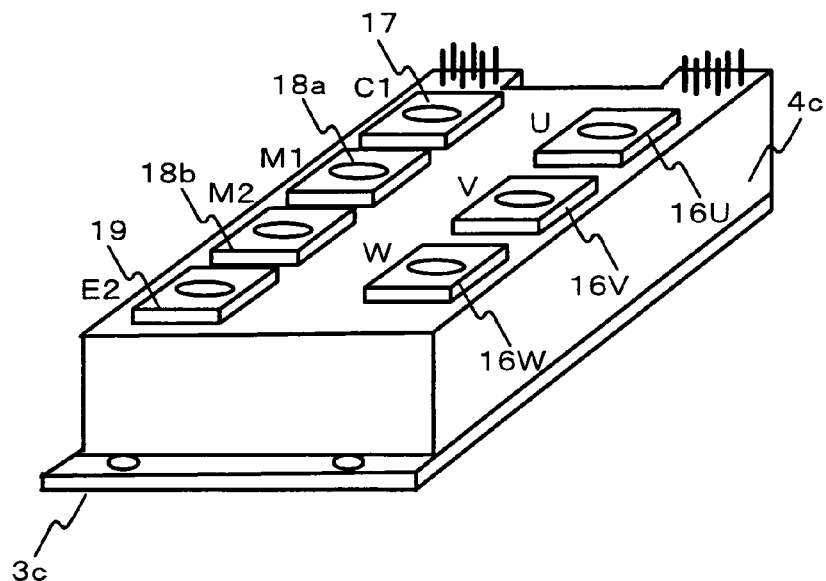
FIG. 4A shows a perspective view of a module according to a fourth embodiment of the present invention, and 4B is a circuit diagram showing the construction of the module.
Figure 4B:
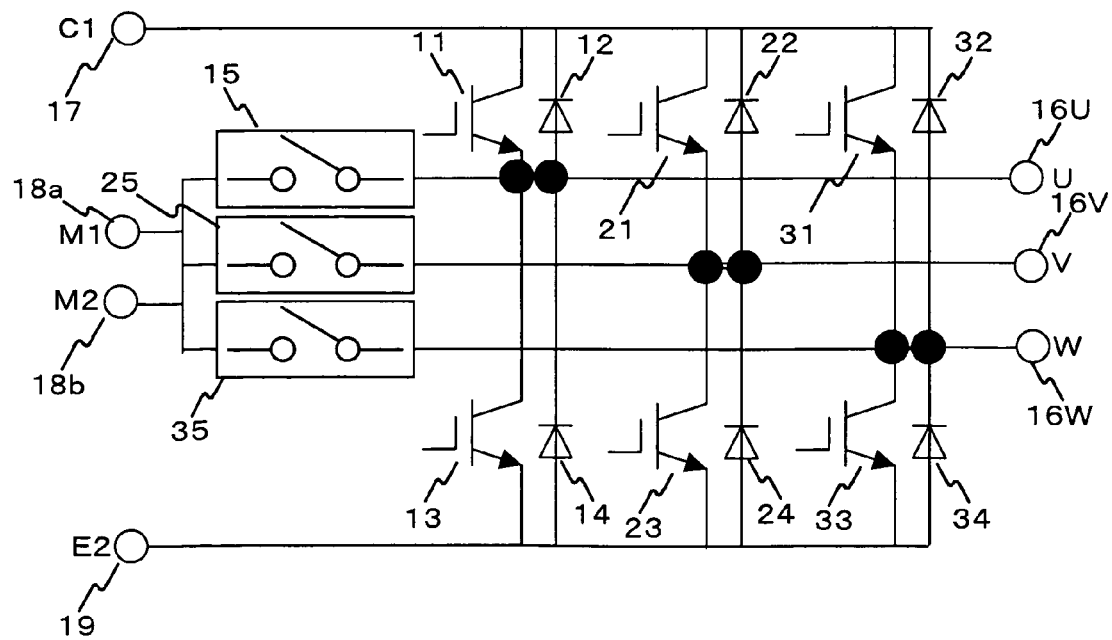

FIGS. 4A and 4B show a fourth embodiment of the present invention. The difference from the third embodiment resides in that the terminal connected to the neutral point potential M of the DC power source is divided into terminals M1 and M2, and the other construction is identical to that of the third embodiment. By providing the M1 terminal and the M2 terminal, the inductance can be further reduced, and the wiring structure between the module and the DC power source can be simplified, and the price of the device can be reduced due to reduction in the number of steps.

Fifth Embodiment

Figure 5A:
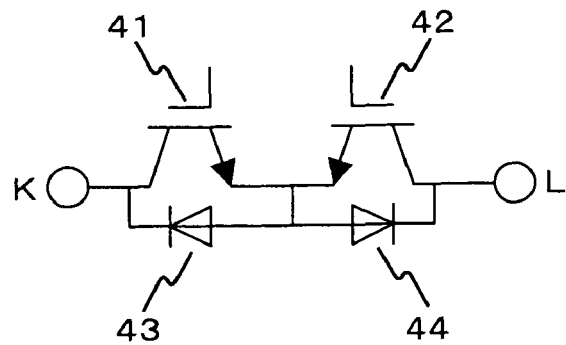
FIGS. 5A, 5B, and 5C show examples of the construction of an AC switch.
Figure 5B:
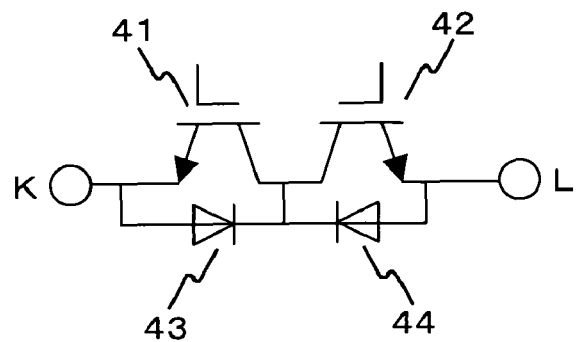

FIGS. 5A and 5B show an example of the construction of the AC switches 15, 25, and 35 used in the first to fourth embodiments. In the example shown in FIGS. 5A and 5B, the reverse breakdown voltage of a normal IGBT is small, and thus the IGBTs and the diodes are connected to each other in series to secure a suitable breakdown voltage in the reverse direction. FIG. 5A shows the circuit construction of an AC switch in which the emitter of IGBT 41, to which the diode 43 is connected in a reverse parallel manner, is connected to the emitter of IGBT 42, to which the diode 44 is connected in a reverse parallel manner. When current is made to flow from the terminal K to the terminal L, IGBT 41 is turned on to make the current flow in the direction from IGBT 41 to the diode 44. When current is made to flow from the terminal L to the terminal K, IGBT 42 is turned on to make the current flow in the direction from IGBT 42 to the diode 43.

FIG. 5B shows the circuit construction of an AC switch in which the collector of IGBT 41, to which the diode 43 is connected in a reverse parallel manner, is connected to the collector of IGBT 42, to which the diode 44 is connected in a reverse parallel manner. When current is made to flow from the terminal K to the terminal L, IGBT 42 is turned on to make the current flow in the direction from the diode 43 to IGBT 42. When current is made to flow from the terminal L to the terminal K, IGBT 41 is turned on to make the current flow in the direction from the diode 44 to IGBT 41.

Figure 5C:
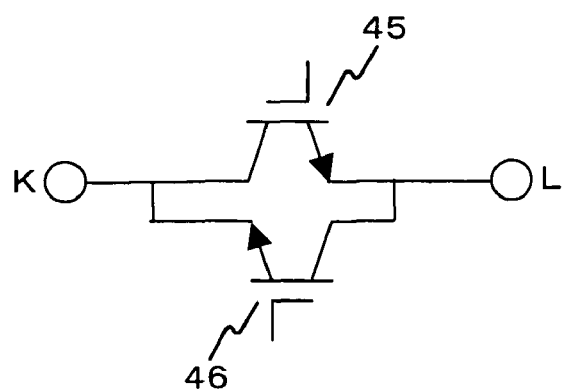

FIG. 5C shows an AC switch constructed by connecting, in a reverse parallel manner, reverse blocking IGBTs 45 and 46, which are IGBTs having withstand voltages in the reverse direction. When current is made to flow from the terminal K to the terminal L, the reverse blocking IGBT 45 is turned on, and when current is made to flow from the terminal L to the terminal K, the reverse blocking IGBT 46 is turned on.

In the above embodiments, reverse series circuits of IGBTs and a reverse parallel connection circuit of reverse blocking IGBTs are used as the AC switch. However, the AC switch may be implemented by a combination circuit of a diode bridge circuit and an IGBT or other types of semiconductor switching elements. Furthermore, in the example of FIGS. 1 and 2, the AC output terminal (E1C1) is not arranged on a line with the other terminals; however, they may all be arranged along the same line.

The present US application is directed to an invention disclosed in Japanese application 2007-023667, filed on Feb. 2, 2007, and published on Aug. 21, 2008. The entire disclosure of this prior Japanese application is incorporated herein by reference.

According to the present invention, two IGBTs, to which diodes are respectively connected, are connected to each other in series to form a series connection circuit. The series connection circuit and an AC switch are packaged in a single module. Straight conductors can be used to connect a power source to terminals on the module, thereby reducing inductance and thus also voltage spikes. The present invention is applicable to a 3-phase inverter circuit, a 3-phase converter circuit, a resonance type circuit, etc.

What is claimed is:

1. A three-phase inverter for use with a DC power source having a positive terminal, a negative terminal, and a neutral terminal, comprising:
  a power semiconductor module that includes:
    a package;
    a first IGBT in the package, the first IGBT having a collector and an emitter, the collector of the first IGBT being connected to the positive terminal of the DC power source;
    a first diode in the package, the first diode having a cathode that is connected to the collector of the first IGBT and having an anode that is connected to the emitter of the first IGBT;
    a second IGBT in the package, the second IGTBT having a collector and an emitter, the emitter of the second IGBT being connected to the negative terminal of the DC power source and the collector of the second IGBT being connected to the emitter of the first IGBT at an intermediate connection point;
    a second diode in the package, the second diode having a cathode that is connected to the collector of the second IGBT and having an anode that is connected to the emitter of the second IGBT; and
    a semiconductor AC switch in the package, the semiconductor AC switch being connected between the neutral terminal of the DC power source and the intermediate connection point of the first and second IGBTs.

2. The inverter of claim 1, wherein the semiconductor AC switch comprises:
  a third IGBT having a collector and an emitter;
  a third diode having a cathode that is connected to the collector of the third IGBT and an anode that is connected to the emitter of the third IGBT;
  a fourth IGBT having a collector and an emitter, the fourth IGBT being connected to the third IGBT; and
  a fourth diode having a cathode that is connected to the collector of the fourth IGBT and anode that is connected to the emitter of the fourth IGBT.

3. The inverter of claim 2, wherein the collector of the third IGBT is connected to the collector of the fourth IGBT, or the emitter of the third IGBT is connected to the emitter of the fourth IGBT.

4. The inverter of claim 1, wherein the semiconductor AC switch comprises a third IGBT having a collector and an emitter, and a fourth IGBT having a collector that is connected to the emitter of the third IGBT and an emitter that is connected to the collector of the third IGBT.

5. The inverter of claim 1, further comprising first and second neutral point terminals on the package, the first and second neutral point terminals both being connected to the semiconductor AC switch.

6. The inverter of claim 1, further comprising a positive terminal, a negative terminal, and a neutral point terminal on the package, the positive, negative, and neutral point terminals on the package being arranged along a straight line.

7. The inverter of claim 6, wherein straight conductors connect the positive, negative, and neutral point terminals on the case to the positive, negative, and neutral point terminals of the DC power source.

8. A three-phase inverter for use with a DC power source having a positive terminal, a negative terminal, and a neutral terminal, comprising:
  a power semiconductor module that includes:
    a package;
    a plurality of one-phase switch circuits in the package, each one-phase switch circuit including:
      a first IGBT having a collector and an emitter, the collector of the first IGBT being connected to the positive terminal of the DC power source,
      a first diode having a cathode that is connected to the collector of the first IGBT and having an anode that is connected to the emitter of the first IGBT,
      a second IGTBT having a collector and an emitter, the emitter of the second IGBT being connected to the negative terminal of the DC power source and the collector of the second IGBT being connected to the emitter of the first IGBT at an intermediate connection point, and
      a second diode having a cathode that is connected to the collector of the second IGBT and having an anode that is connected to the emitter of the second IGBT; and
    a plurality of semiconductor AC switches in the package, each semiconductor AC switch being connected between the neutral terminal of the DC power source and the intermediate connection point of the first and second IGBTs in a respective one of the one-phase switch circuits.

9. The inverter of claim 8, wherein each semiconductor AC switch comprises:
- a third IGBT having a collector and an emitter;
- a third diode having a cathode that is connected to the collector of the third IGBT and an anode that is connected to the emitter of the third IGBT;
- a fourth IGBT having a collector and an emitter, the fourth IGBT being connected to the third IGBT; and
- a fourth diode having a cathode that is connected to the collector of the fourth IGBT and anode that is connected to the emitter of the fourth IGBT.

10. The inverter of claim 9, wherein the collectors of the third and fourth IGBTs of each semiconductor AC switch are connected together, or the emitters of the third and fourth IGBTs of each semiconductor AC switch are connected together.

11. The inverter of claim 8, wherein each semiconductor AC switch comprises a third IGBT having a collector and an emitter, and a fourth IGBT having a collector that is connected to the emitter of the third IGBT and an emitter that is connected to the collector of the third IGBT.

12. The inverter of claim 8, further comprising first and second neutral point terminals on the package, the first and second neutral point terminals both being connected to the semiconductor AC switches.

13. The inverter of claim 8, further comprising a positive terminal, a negative terminal, and a neutral point terminal on the package, the positive, negative, and neutral point terminals on the package being arranged along a straight line.

14. The inverter of claim 13, wherein straight conductors connect the positive, negative, and neutral point terminals on the case to the positive, negative, and neutral point terminals of the DC power source.

15. A modular power supply component for use with a DC power source having a positive terminal, a negative terminal, and a neutral terminal, comprising:
- a package having first, second, and third terminals that are disposed along a straight line;
- first and second IGBTs that disposed in the package and that are connected in series between the first and third terminals, the first and second IGBTs being connected to one another at an intermediate connection point; and
- a semiconductor AC switch that is disposed in the package and that is connected between the second terminal and the intermediate connection point, wherein the first terminal is connected to the positive terminal of the DC power source, the second terminal is connected to the neutral terminal of the DC power source, and the third terminal is connected to the negative terminal of the DC power source.

16. The modular power supply component of claim 15, wherein the first terminal is connected to the positive terminal of the DC power source by a first metal strip that is straight, the second terminal is connected to the neutral terminal of the DC power source by a second metal strip that is straight, and the third terminal is connected to the negative terminal of the DC power source by a third metal strip that is straight.

17. The modular power supply component of claim 16, wherein the first metal strip has a first width and the second metal strip has a maximum width that is substantially greater than the first width.

18. The modular power supply component of claim 15, wherein the semiconductor AC switch is a first semiconductor AC switch, the intermediate connection point is a first intermediate connection point, and further comprising:
- third and fourth IGBTs that disposed in the package and that are connected in series between the first and third terminals, the first and second IGBTs being connected to one another at a second intermediate connection point;
- a second semiconductor AC switch that is disposed in the package and that is connected between the second terminal and the second intermediate connection point;
- fourth and fifth IGBTs that disposed in the package and that are connected in series between the first and third terminals, the first and second IGBTs being connected to one another at a third intermediate connection point;
- a third semiconductor AC switch that is disposed in the package and that is connected between the second terminal and the third intermediate connection point; and
- fourth, fifth, and sixth terminals that are disposed on the package, the fourth terminal being connected to the first intermediate connection point, the fifth terminal being connected to the second intermediate connection point, and the sixth terminal being connected to the third intermediate connection point, the fourth, fifth, and sixth terminals being connected to a three-phase load.

* * * * *